(12) United States Patent
Ogino (10) Patent No.: US 6,479,995 B1
(45) Date of Patent: Nov. 12, 2002

(54) MAGNETIC RESONANCE SIGNAL RECEIVING METHOD AND APPARATUS AND MAGNETIC RESONANCE IMAGING APPARATUS

(75) Inventor: Tetsuo Ogino, Tokyo (JP)

(73) Assignee: GE Yokogawa Medical Systems, Limited, Tokyo (JP)

( * ) Notice: Subject to any disclaimer, the term of this patent is extended or adjusted under 35 U.S.C. 154(b) by 142 days.

(21) Appl. No.: 09/597,526

(22) Filed: Jun. 20, 2000

(30) Foreign Application Priority Data

Aug. 27, 1999 (JP) .......................................... 11-240961

(51) Int. Cl.$^7$ ................................................ G01V 3/00
(52) U.S. Cl. ....................................... 324/309; 324/307
(58) Field of Search ................................ 324/309, 307, 324/306, 300, 318, 310, 311, 312

(56) References Cited

U.S. PATENT DOCUMENTS

| 4,551,679 | A | | 11/1985 | Bossaert | 324/309 |
|---|---|---|---|---|---|
| 5,341,098 | A | * | 8/1994 | Hennig | 324/309 |
| 5,726,569 | A | | 3/1998 | Krieg | 324/309 |
| 5,786,692 | A | * | 7/1998 | Maier et al. | 324/307 |

FOREIGN PATENT DOCUMENTS

JP 8103427 4/1996

\* cited by examiner

*Primary Examiner*—Edward Lefkowitz
*Assistant Examiner*—Tiffany A. Fetzner
(74) *Attorney, Agent, or Firm*—Moonray Kojima (57) ABSTRACT

In order to provide a magnetic resonance signal receiving method and apparatus for performing imaging with good quality and an magnetic resonance imaging apparatus employing such a magnetic resonance signal receiving apparatus, gradient magnetic fields Gs1k and Gs2k for dephasing spins are applied with their strengths varied after each spin echo is received in line scanning.

16 Claims, 6 Drawing Sheets

MAGNETIC RESONANCE SIGNAL RECEIVING METHOD AND APPARATUS AND MAGNETIC RESONANCE IMAGING APPARATUS

BACKGROUND OF THE INVENTION

The present invention relates to a magnetic resonance signal receiving method and apparatus and a magnetic resonance imaging apparatus, and more particularly to a magnetic resonance signal receiving method and apparatus for receiving a spin echo from spins that lie in two slices intersecting each other and are excited by 90° and 180°, respectively, while translating the intersection in an imaged space, and a magnetic resonance imaging apparatus employing such a magnetic resonance signal receiving apparatus.

Figure 1:
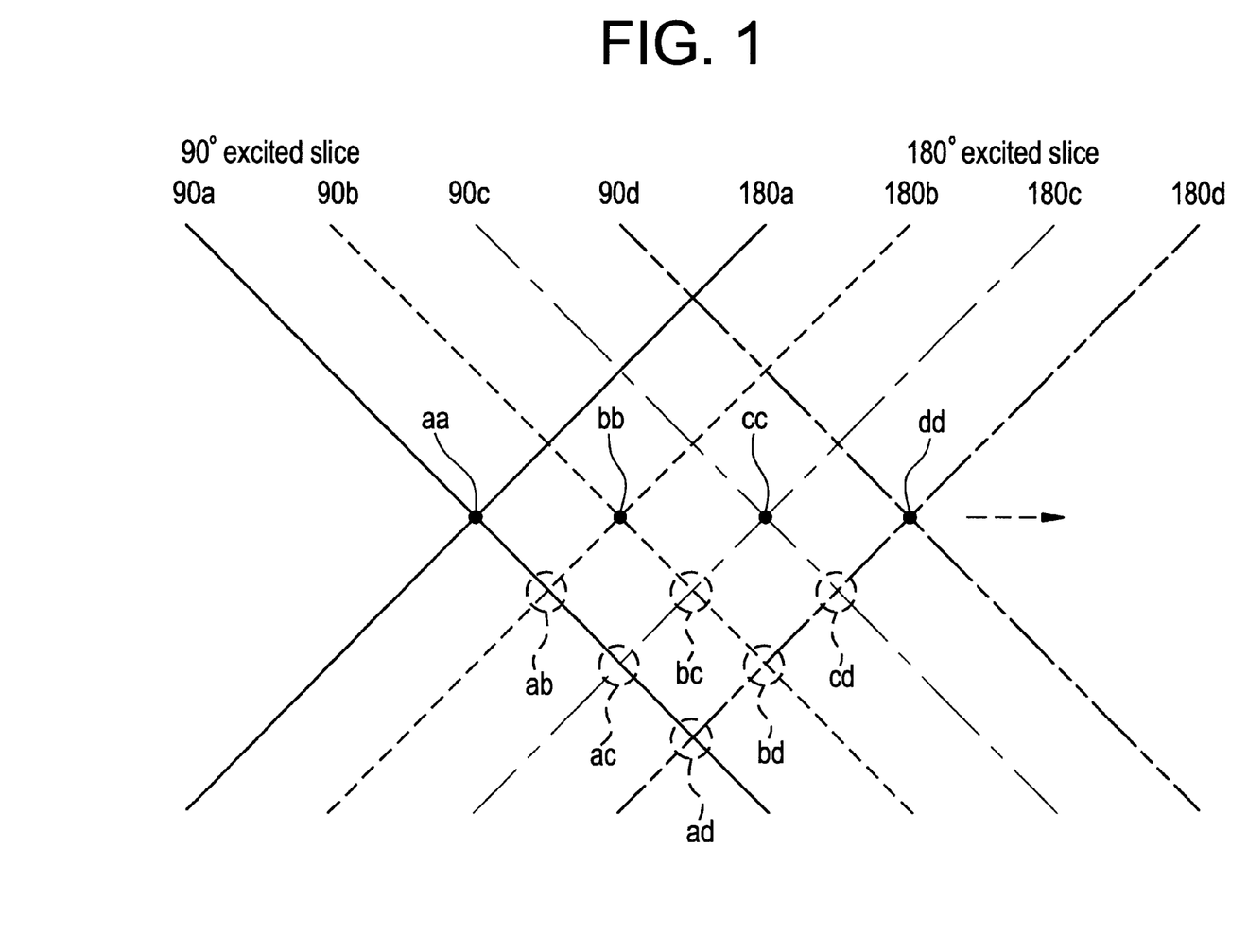
FIG. 1 illustrates the concept of line scanning.

As exemplarily shown in FIG. 1, magnetic resonance imaging by line scanning involves exciting spins lying in two slices 90a and 180a intersecting each other by 90° and 180°, respectively, receiving a spin echo generated at the intersection aa of the slices, and performing a one-dimensional inverse Fourier transformation on the received spin echo to reconstruct a line image relating to the intersection aa.

By changing the combination of slices to be excited by 90° and 180°, the intersection is sequentially translated as indicated by bb, cc, dd . . . , to sequentially obtain a plurality of line images, and an image for one screen is produced from a set of the line images.

In line scanning, the effect of body motion of the imaged object is limited to the line image acquired when the body motion happens to occur, and does not affect the whole image. Taking advantage of this characteristic, line scanning is used for acquiring diffusion images, which especially tend to be affected by body motion.

In such line scanning, a slice excited by 90°, e.g., 90a, will subsequently intersect a 180° excited slice 180b for imaging a next line bb, a 180° excited slice 180c for imaging a following line cc, and a 180° excited slice 180d for imaging a next following line dd, and so forth. Therefore, if spins in the 90° excited slice 90a are not fully relaxed, spin echoes are generated at intesections with these 180° slices, i.e., ab, ac and ad. This is also true for other 90° excited slices 90b, 90c and 90d which generate spin echoes at intersections bc, cd, and bd.

Because such spin echoes have the same timing as spin echoes of proper lines to be acquired thereafter, the reconstructed image comes to contain artifacts, resulting in lower quality.

SUMMARY OF THE INVENTION

It is thereefore an object of the invention to provide a magnetic resonance signal receiving method and apparatus for preforming imaging with good quality, and a magnetic resonance imaging apparatus employing such a magnetic resonance signal receiving apparatus.

In accordance with a first aspect of the invention, there is provided a magnetic resonance signal receiving method for receiving a spin echo from spins that lie in two slices intersecting each other and are excited by 90° and 180°, respectively, while translating the intersection in a imaged space, comprising applying a grdient magnetic field for dephasing spins whose strength is varied after each spin echo is received.

In accordance a second aspect of the invention, there is provided a magnetic resonance signal receiving apparartus for receiving a spin echo from spins that lie in two slices intersecting each other and are excited by 90° and 180°, respectively, while translating the intersection in an imaged space, comprising gradient magnetic field appling means for applying a gradient magnetic field for dephasing spins whose strength is varied after each spin echo is received.

In accordance with a third aspect of the invention, there is provided a magnetic resonance imaging apparatus for periodically receiving a spin echo from spins that lie in two slices intersecting each other and are excited by 90° and 180°, respectively, while translating the intersection in an imaged space, and producing an image based on the received spin echo, comprising gradient magnetic field applying means for applying a gradient magnetic field for dephasing spins whose strength is varied after each spin echo is received.

(EFFECT)

According to the present invention, by applying a gradient magnetic field for dephasing spins whose strength is varied after each spin echo is received, generation of an unwanted spin echo is prevented.

Thus, the present invention can provide a magnetic resonance signal receiving method and apparatus for performing imaging with good quality, and a magnetic resonance imaging apparatus employing such a magnetic resonance signal receiving apparatus.

Further objects and advantages of the present invention will be apparent from the following description of the preferred embodiments of the invention as illustrated in the accompanying drawings.

DETAILED DESCRIPTION OF THE INVENTION

Figure 2:
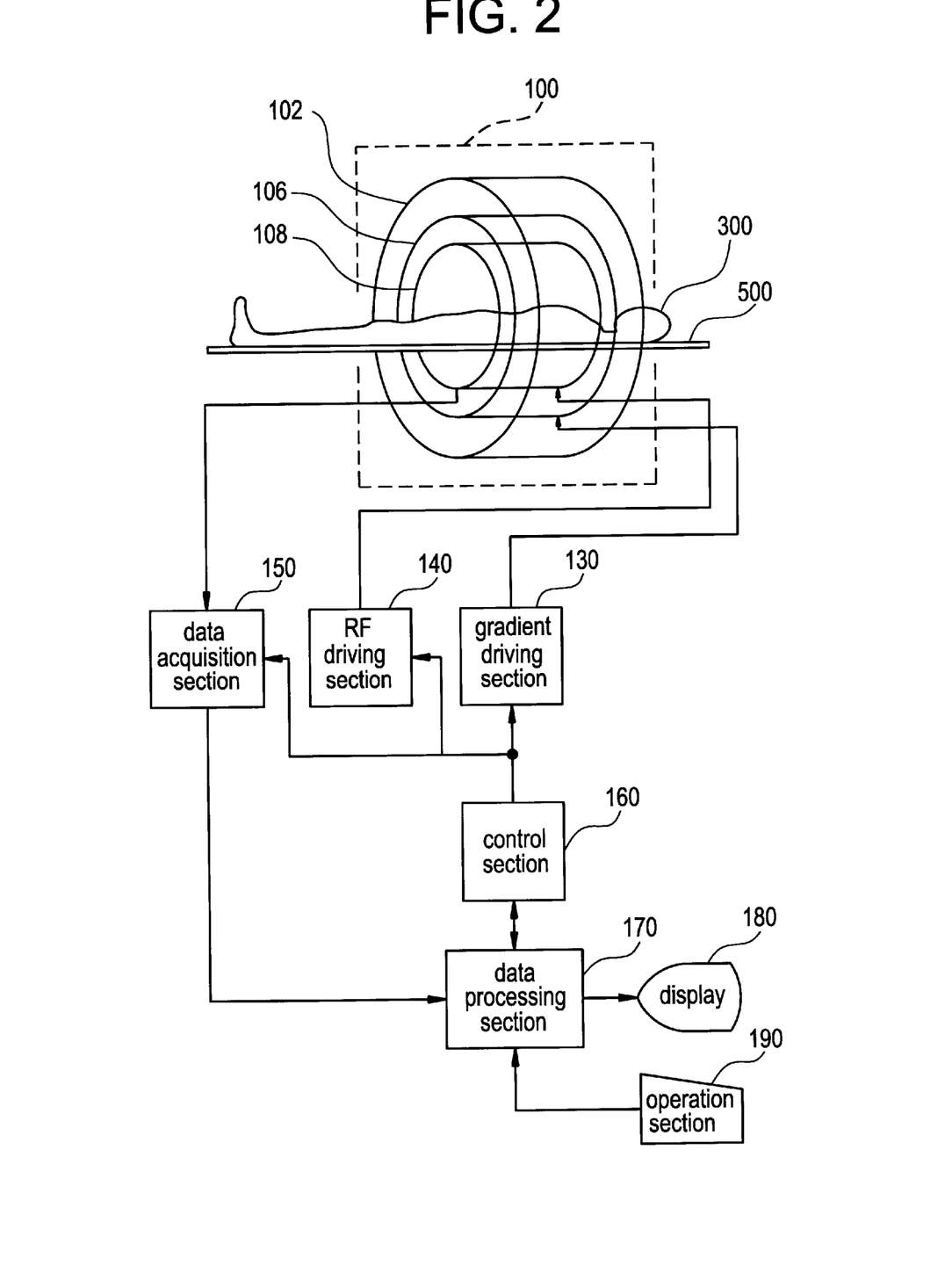
FIG. 2 is a block diagram of an exemplary apparatus in accordance with one embodiment of the present invention.

Several embodiments of the present invention will now be described in detail with reference to the accompanying drawings. FIG. 2 shows a block diagram of a magnetic resonance imaging apparatus, which is an embodiment of the present invention. The configuration of the apparatus represents an embodiment of the apparatus in accordance with the present invention, and the operation of the apparatus represents an embodiment of the method in accordance with the present invention.

The configuration of the apparatus will be now described. As shown in FIG. 2, the present apparatus has a magnet system 100. The magnet system 100 has a main magnetic field coil section 102, a gradient coil section 106 and an RF (radio frequency) coil section 108. These coil sections have a generally cylindrical outer shape and are concentrically disposed. An imaged object 300 is rested on a cradle 500 and carried into and out of the internal space of the magnet system 100 by carrier means (not shown).

The main magnetic field coil section 102 generates a static magnetic field in the internal space of the magnet system 100. The direction of the static magnetic field is generally in parallel with the body axis of the imaged object 300, i.e., a "horizontal" magnetic field is generated. The main magnetic field coil section 102 is made using a superconductive coil, for example. It will be easily recognized that the main magnetic field coil section 102 is not limited to a superconductive coil, but may be made using a normal conductive coil or the like.

The gradient coil section 106 generates gradient magnetic fields for imparting gradients to the static magnet field strength. The gradient magnetic fields to be generated include two slice gradient magnetic fields and a readout gradient magnetic field. The two slice gradient magnetic fields have respective gradients in directions orthogonal to each other. The readout gradient magnetic field has a gradient in a direction orthogonal to the two slice gradient directions. The gradient coil section 106 has three gradient coils (not shown) corresponding to these three gradient magnetic fields. A gradient magnetic field is referred to simply as a gradient hereinbelow.

The RF coil section 108 generates a high frequency magnetic field in the static magnetic field space to excite spins within the imaged object 300. The generation of the high frequency magnetic field will be referred to as transmission of an RF excitation signal hereinbelow. The RF coil section 108 also receives an electromagnetic wave generated by the excited spins, i.e., a magnetic resonance signal. The RF coil section 108 has a transmit coil and a receive coil (not shown). The transmit and receive coils are either the same coil or separate dedicated coils.

The gradient coil section 106 is connected with a gradient driving section 130 for supplying driving signals to the gradient coil section 106 to generate the gradient magnetic fields. The gradient driving section 130 has three driving circuits (not shown) corresponding to the three gradient coils in the gradient coil section 106.

The RF coil section 108 is connected with an RF driving section 140 for supplying driving signals to the RF coil section 108 to transmit the RF excitation signals, thereby exciting the spins within the imaged object 300.

The RF coil section 108 is also connected with a data acquisition section 150 for gathering signals received by the RF coil section 108 and acquiring the signals as digital data.

The gradient driving section 130, RF driving section 140 and data acquisition section 150 are connected with a control section 160 for controlling these sections 130–150.

A portion consisting of the main magnetic field coil section 102, gradient coil section 106, gradient driving section 130, RF coil section 108, data acquisition section 150 and control section 160 is an embodiment of the magnetic resonance signal receiving apparatus of the present invention. The configuration of the apparatus represents an embodiment of the apparatus in accordance with the present invention, and the operation of the apparatus represents an embodiment of the method in accordance with the present invention. A portion consisting of the main magnetic field coil section 102, gradient coil section 106, gradient driving section 130 and control section 160 is an embodiment of the gradient magnetic field applying means of the present invention.

The data acquisition section 150 is connected to a data processing section 170. The data processing section 170 stores data gathered from the data acquisition section 150 in a memory (not shown). The data processing section 170 reconstructs a tomographic image of the imaged object 300 using the data stored in the memory.

The data processing section 170 is connected to the control section 160. The data processing section 170 is above the control section 160 and controls the section 160. The data processing section 170 is connected with a display section 180 that displays the reconstructed image and several kinds of information output from the data processing section 170, and an operating section 190 that is operated by a human operator and inputs several commands, information and so forth to the data processing section 170.

Figure 3:
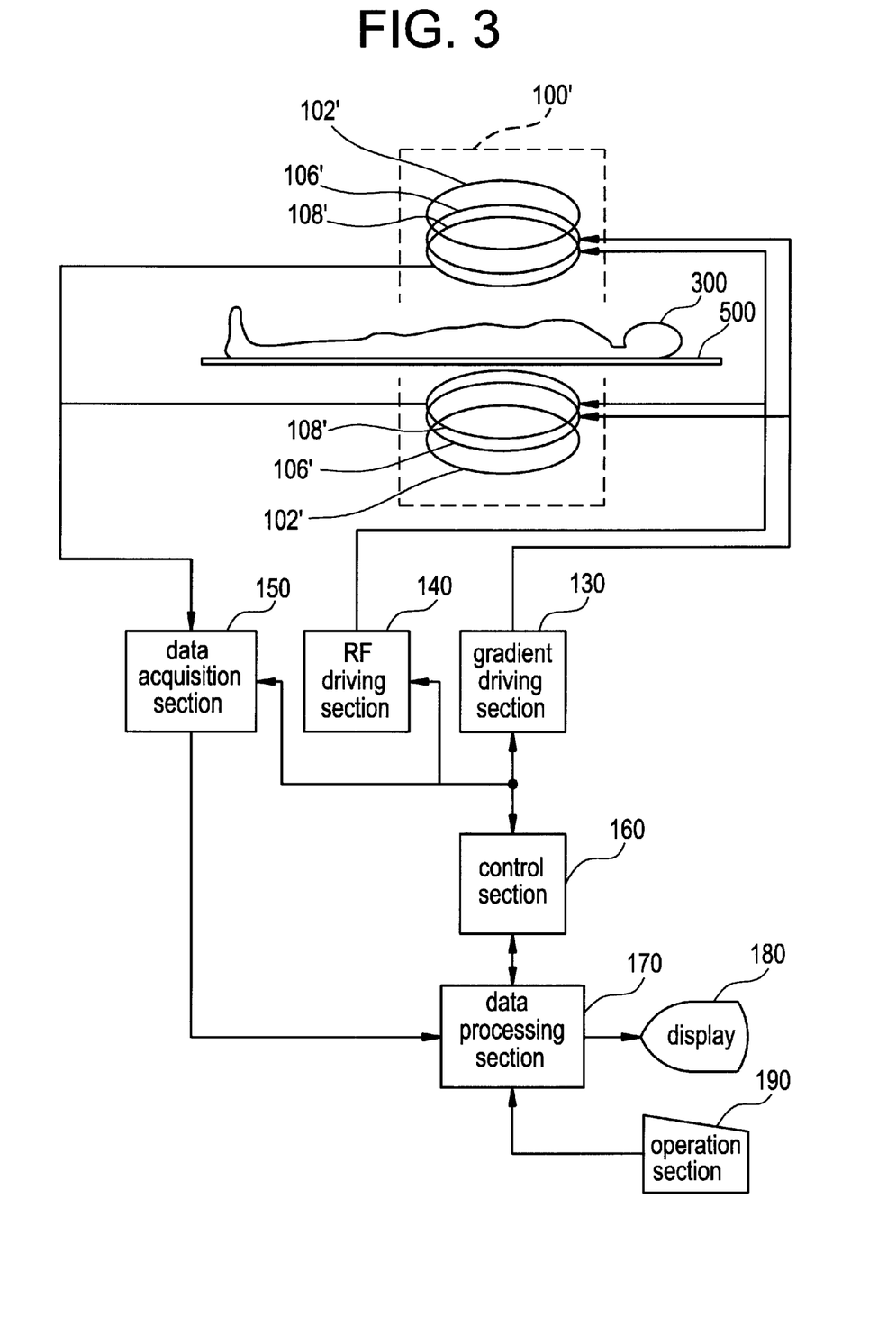
FIG. 3 is a block diagram of an exemplary apparatus in accordance with another embodiment of the present invention.

FIG. 3 shows a block diagram of another magnetic resonance imaging apparatus, which is an embodiment of the present invention. The configuration of the apparatus represents an embodiment of the apparatus in accordance with the present invention, and the operation of the apparatus represents an embodiment of the method in accordance with the present invention.

The apparatus shown in FIG. 3 has a different magnet system 100' from the apparatus shown in FIG. 2. Components other than the magnet system 100' are configured similarly to those in the apparatus shown in FIG. 2. Similar parts are designated by similar reference numerals and explanation thereof will be omitted.

The magnet system 100' has a main magnetic field magnet section 102', a gradient coil section 106' and an RF coil section 108'. The main magnetic field magnet section 102' and the coil sections 106' and 108' each comprises a pair of members facing each other across a space. These sections have a generally disk-like outer shape and are disposed to have a common center axis. The imaged object 300 is rested on the cradle 500 and carried into and out of the internal space of the magnet system 100' by carrier means (not shown).

The main magnetic field magnet section 102' generates a static magnetic field in the internal space of the magnet system 100'. The direction of the static magnetic field is generally orthogonal to the direction of the body axis of the imaged object 300, i.e., a "vertical" magnetic field is generated. The main magnetic field magnet section 102' is made using a permanent magnet, for example. It will be easily recognized that the main magnetic field magnet section 102' is not limited to a permanent magnet, but may be made using a superconductive or normal conductive electromagnet, etc.

The gradient coil section 106' generates gradient magnetic fields for imparting gradients to the static magnet field strength. The gradient magnetic fields to be generated include two slice gradient magnetic fields and a readout gradient magnetic field. The two slice gradient magnetic fields have respective gradients in directions orthogonal to each other. The readout gradient magnetic field has a gradient in a direction orthogonal to the two slice gradient directions. The gradient coil section 106' has three gradient coils (not shown) corresponding to these three gradient magnetic fields.

The RF coil section 108' transmits an RF excitation signal to the static magnetic field space to excite spins within the imaged object 300. The RF coil section 108' also receives a magnetic resonance signal generated by the excited spins. The RF coil section 108' has a transmit coil and a receive coil (not shown). The transmit and receive coils are either the same coil or separate dedicated coils.

The operation of the present apparatus will now be described. The apparatus shown in FIG. 2 and that shown in FIG. 3 are identical in operation. FIGS. 4(A)–4(E) show an exemplary pulse sequence for use in magnetic resonance imaging. The illustrated pulse sequence is based on a line scanning pulse sequence.

Figure 4A:
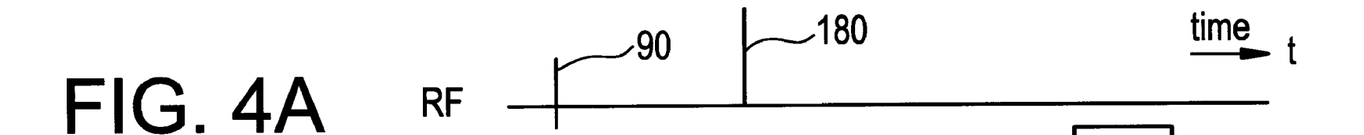
FIGS. 4(A)–4(E) show an exemplary pulse sequence executed by the apparatus shown in FIG. 2 or 3.

Specifically, FIG. 4(A) is a sequence of a 90° pulse and a 180° pulse for RF excitation in line scanning, and FIGS. 4(B)–4(E) are sequences of slice gradients Gs1 and Gs2, a readout gradient Gr, and a spin echo MR in line scanning, respectively. It should be noted that the 90° and 180° pulses are represented by their respective center signals. The pulse sequence proceeds from the left to the right along a time axis t.

As shown, the 90° pulse produces 90° excitation of the spins. At the same time, the slice gradients Gs1 and Gs2 are simultaneously applied to selectively excite the slice 90*a*, for example, as shown in FIG. 1, by 90°. After a predetermined time from the 90° excitation, 180° excitation by the 180° pulse is achieved. Again, the slice gradients Gs1 and Gs2 are simultaneously applied to selectively excite by 180° the slice 180*a* that intersects the slice 90*a*. Thus, spins lying in a linear region aa at which the slices intersect are inverted.

Figures 4B, 4C:
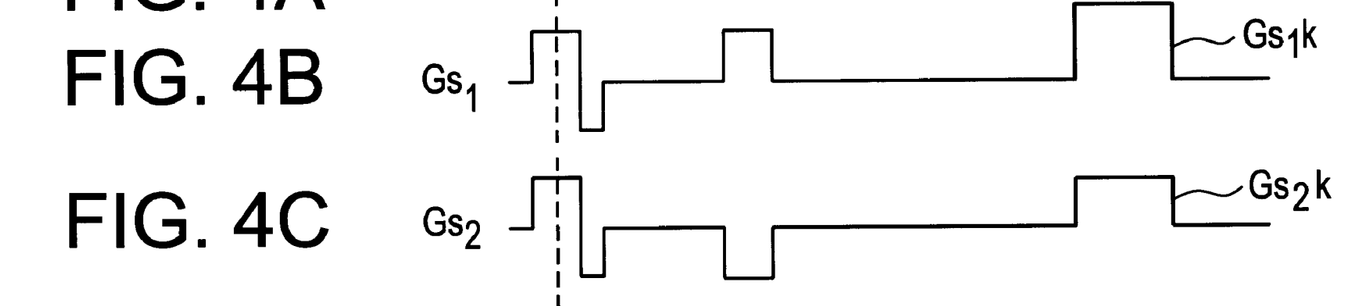
Figure 4D:
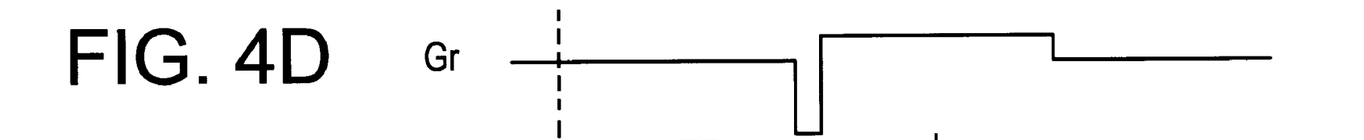
Figure 4E:
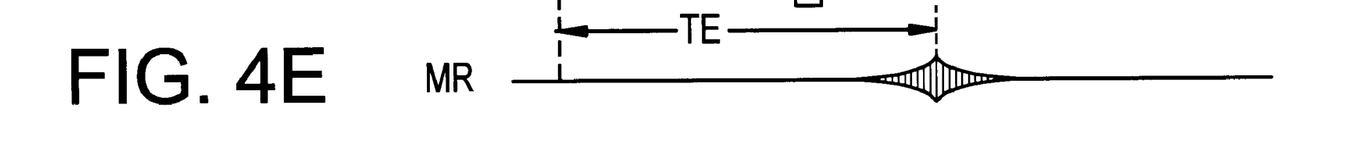

After the 180° excitation, the spins are dephased by the readout gradient Gr. Thereafter, the spins are rephased by the readout gradient Gr. Accompanying the rephasing, the spins inverted in the linear region aa generate a spin echo MR.

The spin echo MR is an RF signal having a symmetric waveform with respect to the echo center. The central echo occurs after a time TE (echo time) from the 90° excitation. The spin echo MR is received at the RF coil section 108, and the received signal is collected as line data by the data acquisition section 150.

After receiving the spin echo, the slice gradient Gs1 and Gs2 are simultaneously applied, thereby fully dephasing the spins within the imaged space. That is, gradient magnetic fields, generally referred to as killer gradients or crusher gradients, are applied. The application of such a killer or crusher gradient differentiates the line scanning pulse sequence from an ordinary one. These gradients are referred to simply as killers hereinbelow.

Such a pulse sequence is repeated about, for example, 64–512 times in a cycle of TR (repetition time). The slice gradients Gs1 and Gs2 are varied for each repetition, and selective excitation is performed on a combination of slices. Thus, 64 [dash]–512 line data, such as bb, cc, dd . . . , are sequentially obtained.

The strengths of the killers Gs1k and Gs2k are varied for each repetition. Moreover, the variation in the killers Gs1k and Gs2k are selected so as not to have substantial periodicity. Such killers can be expressed as follows, for example:

$$Gs1k(n) = G0 \cos(2\pi\alpha \cdot n)$$

$$Gs2k(n) = GO \sin(2\pi\alpha \cdot n), \quad (1)$$

wherein

α: coefficient represented by an irrational number, and n: repetition number (line number).

Figure 5:
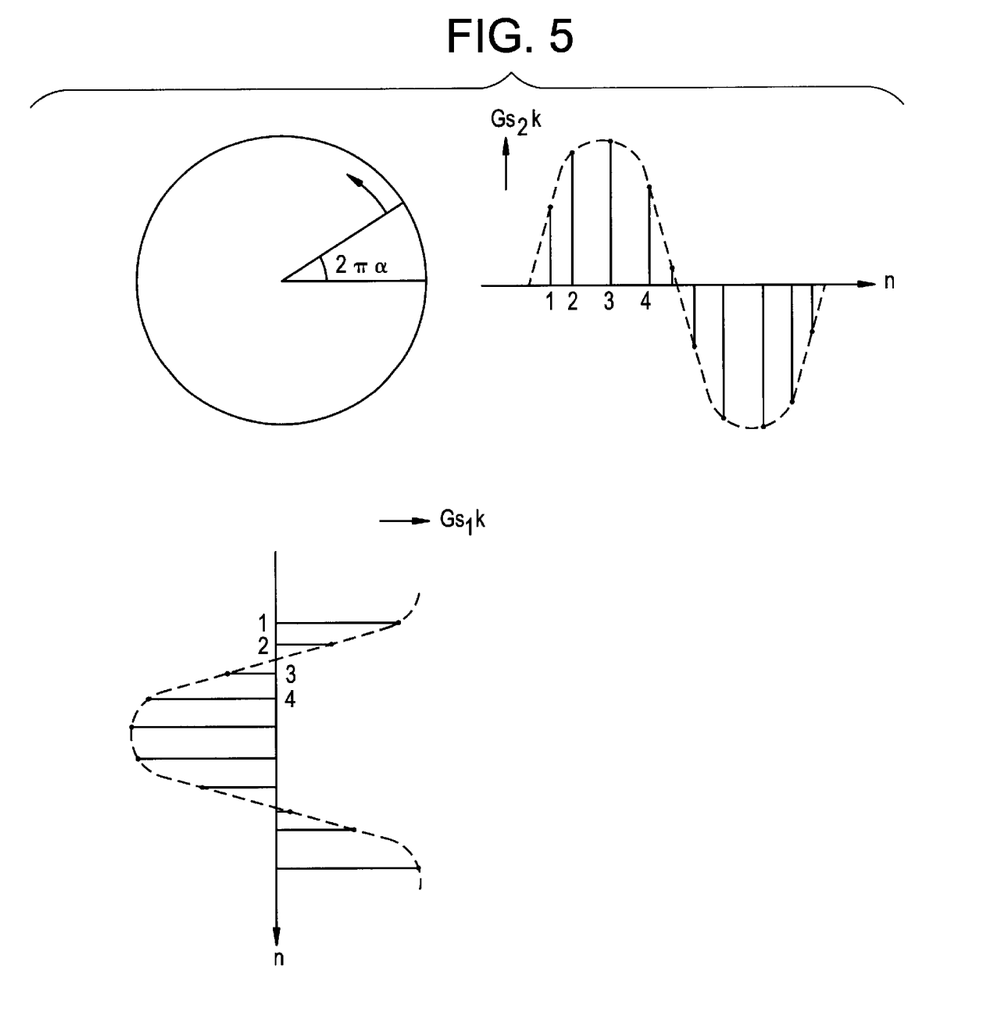
FIG. 5 illustrates an example of the variation in a killer gradient magnetic field in the apparatus shown in FIG. 2 or 3.

FIG. 5 shows an example of the killer strength variation given by Eq. (1). Since an irrational number is employed as the coefficient a, the values of killers Gs1k and Gs2k are prevented from repeating themselves even if the repetition is infinitely continued. It should be noted that the killer strengths may instead be varied based on random numbers.

Figures 6A, 6B:
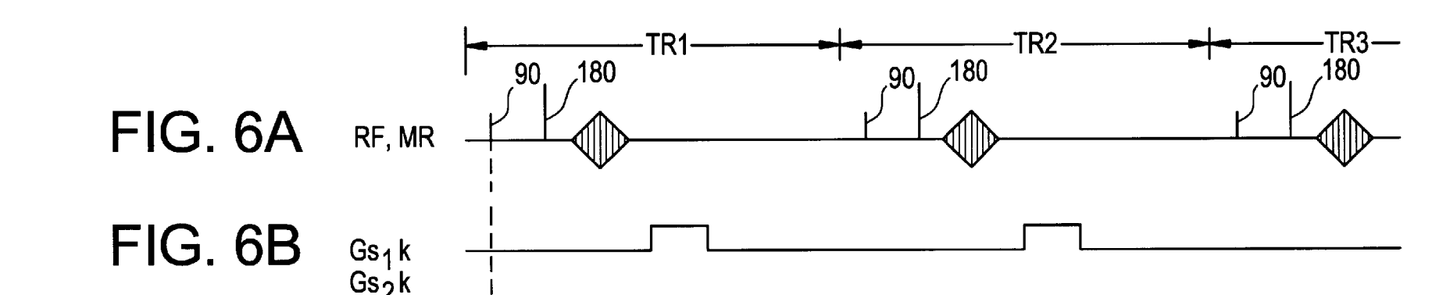
FIGS. 6(A)–6(C) illustrate generation of an unwanted spin echo when the killer gradient magnetic field is not varied.
Figure 6C:
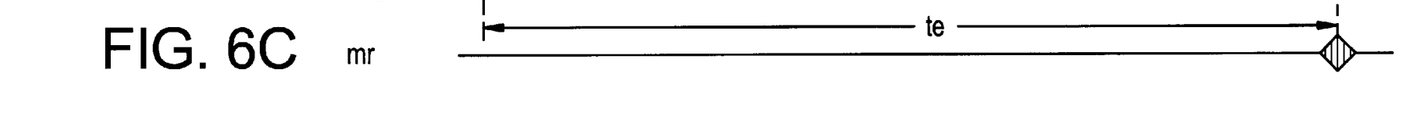

By varying the killer strength each repetition, it is possible to avoid problems that occur when the killer strength is the same each time. Specifically, as shown in FIGS. 6(A)–6(C), if the killer strength is the same each time, 90° excited spins once dephased by the killer in a period TR1 are rewound, or rephased by a killer applied after 180° excitation in a period TR2.

At this time, since the killer has the same strength before and after the 180° excitation, the amount of dephasing and the amount of rephasing become the same, and a spin echo mr will be generated after te from the 90° excitation in the period TR1. The spin echo mr overlaps a proper spin echo in a period TR3, resulting in artifacts.

Since the present apparatus varies the killer strength every time, such a problem can be avoided. However, even if the killer is varied each time, when the killer strength has periodicity, the amounts of dephasing and rephasing become the same between first and second cycles of such periodicity, which may result in a similar unwanted spin echo. Accordingly, the present apparatus eliminates any periodicity and prevents such a problem.

It should be noted that spins excited by 90° exhibit T2 decay, and therefore periodicity results in no substantial problems if the cycle time is a sufficiently longer than the time T2. That is, periodicity need not completely be eliminated, and substantial aperiodicity is only required.

A spin echo is thus acquired for each line without incorporating unwanted signals. The line data are collected in the memory in the data processing section 170. The data processing section 170 performs a one-dimensional inverse Fourier transformation on the line data to reconstruct respective line images, which are arranged in parallel to produce a tomographic image of the imaged object 300. The reconstructed image has good quality not containing artifacts. Such an image of good quality is displayed by the display section 180 as a visible image.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic resonance signal receiving method for receiving a spin echo resulting from spine that lie in two slices intersecting each other and that are excited by 90° and 180° RF pulses, respective, while translating the intersection in an image space, said method comprising the step art of:

applying a different killer gradient magnetic field after each said resetting spin echo is received so as to dephased the spin excited by said 90° and 180° pulses, each said different killer gradient magnetic field having a different strength so as to prevent rewinding of a spin excited by a prior 90° RF pulse, whereby artifacs are avoided.

2. The method of claim 1, wherein said different strength of each different killer gradient magnetic field has no substantial periodicity.

3. The method of claim 1, wherein said different strength of each different killer gradient magnetic field has a substantial periodicity.

4. The method of claim 2, wherein the strength of each of said different killer gradient magnetic field is based on a random number.

5. A magnetic resonance signal receiving apparatus for receiving a spin echo resulting from spins that lie in two slices intersecting each other and that are excited by 90° and 180° RF pulses, respectively, while translating the intersection in an image space, said apparatus comprising:

means for applying a different killer gradient magnetic field after each said resulting spin echo is received so as to dephase the spins excited by said 90° and 180° RF pulses, each said different killer gradient magnetic field having a different strength so as to prevent rewinding of a spin excited by a prior 90° RF pulse, whereby artifacts are avoided.

6. The apparatus of claim 5, wherein said means for applying comprises means for applying different killer gradient magnetic fields having different strengths with no substantial periodicity.

7. The apparatus of claim 5, wherein said means for applying comprises means for applying different killer gradient magnetic fields having different strengths with substantial periodicity.

8. The apparatus of claim 6, wherein said means for applying comprises means for applying different killer gradient magnetic fields having different strengths based an random numbers.

9. A magnetic resonance imaging apparatus for periodically receiving a spin echo resulting from spins that lie In two slices intersecting each other and that are excited by 90° and 180° RF pulses, respectively, while translating the intersection in an image space, and producing an image based on said received spin echo, said apparatus comprising:

means for applying a different killer gradient magnetic field after each said resulting spin echo is received ea as to dephased the spins excited by said 90° and 180° RF pulses, each of said different killer gradient magnetic field having a different strength so as to prevent rewinding of a spin excited by a prior 90° RF pulse, whereby artifacts are avoided.

10. The apparatus of claim 9, wherein said means for applying comprises means for applying different killer gradient magnetic fields having different strengths with no substantial periodicity.

11. The apparatus of claim 9, wherein said means for applying comprises weans for applying different killer gradient magnetic fields having different strengths with substantial periodicity.

12. The apparatus of claim 10, wherein said means for applying comprises means for applying different killer gradient magnetic fields having different strengths bowed on random numbers.

13. A magnetic resonance imaging method for periodically receiving a spin echo resulting from spins that lie in two slices intersecting each other and that are excited by 90° and 180° RF pulses, respectively, while translating the intersection in an image space, and producing an image based on said received spin echo, said method comprising the step of:

applying a different killer gradient magnetic field after each said resulting spin echo is received so as to dephased the spins excited by said 90° and 180° RF pulses, each said different killer gradient magneti field having a different strength so as to prevent rewinding of a spin excited by a prior 90° RF pulse, whereby artifacts are avoided.

14. The method of claim 13, wherein said different strength of each different killer gradient magnetic field has no substantial periodicity.

15. The method of claim 13, wherein said different strength of each different killer gradient magnetic field has substantial periodicity.

16. The method of claim 14, wherein the strength of each of said different killer gradient magnetic field is based on a random number.

\* \* \* \* \*